United States Patent
Hausmann et al.

(10) Patent No.: US 10,662,526 B2
(45) Date of Patent: May 26, 2020

(54) METHOD FOR SELECTIVE DEPOSITION USING A BASE-CATALYZED INHIBITOR

(71) Applicant: Lam Research Corporation, Fremont, CA (US)

(72) Inventors: Dennis Hausmann, Lake Oswego, OR (US); Alexander R. Fox, Portland, OR (US); Paul C. Lemaire, Raleigh, NC (US); David Charles Smith, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 25 days.

(21) Appl. No.: 16/149,948

(22) Filed: Oct. 2, 2018

(65) Prior Publication Data

US 2020/0102650 A1   Apr. 2, 2020

(51) Int. Cl.
*C23C 16/04* (2006.01)
*C23C 16/40* (2006.01)
*C23C 16/455* (2006.01)
*C23C 16/52* (2006.01)

(52) U.S. Cl.
CPC ........ *C23C 16/45534* (2013.01); *C23C 16/04* (2013.01); *C23C 16/45553* (2013.01); *C23C 16/52* (2013.01)

(58) Field of Classification Search
CPC ....... C23C 16/04; C23C 16/042; C23C 16/40; C23C 16/45525; C23C 16/45534
See application file for complete search history.

(56) References Cited

U.S. PATENT DOCUMENTS

| | | | | |
|---|---|---|---|---|
| 6,297,169 B1* | 10/2001 | Mangat | ............... | B82Y 10/00 378/35 |
| 7,288,145 B2* | 10/2007 | Xiao | ............... | C07F 7/10 106/287.11 |
| 2008/0160200 A1* | 7/2008 | Stanjek | ............... | C08G 18/718 427/387 |
| 2008/0241489 A1* | 10/2008 | Ishibashi | ............... | G03F 7/11 428/199 |

(Continued)

FOREIGN PATENT DOCUMENTS

| | | | |
|---|---|---|---|
| JP | 11-84683 | * | 3/1999 |
| JP | 2017222928 A | | 12/2017 |
| KR | 10-2013-0065647 A | | 6/2013 |

OTHER PUBLICATIONS

Zheng, Jiabao, et al., "Top-down fabrication of high-uniformity nanodiamonds by self-assembled block copolymer masks". Scientific Reports (2019) 9:6914, pp. 1-6.*

(Continued)

*Primary Examiner* — Bret P Chen
(74) *Attorney, Agent, or Firm* — Penilla IP, APC

(57) ABSTRACT

A method is provided, including the following operations: simultaneously applying an organosilyl chloride inhibitor and a Lewis base to a surface of a substrate, the organosilyl chloride inhibitor being configured to adsorb onto dielectric regions of the surface of the substrate; performing a plurality of cycles of an ALD process to deposit a metal oxide onto the surface of the substrate; wherein the applying of the organosilyl chloride inhibitor and the Lewis base prevents the ALD process from depositing the metal oxide onto the dielectric regions of the surface of the substrate.

19 Claims, 7 Drawing Sheets

(56) References Cited

U.S. PATENT DOCUMENTS

| | | | |
|---|---|---|---|
| 2008/0265415 A1 | 10/2008 | Colburn et al. | |
| 2011/0059403 A1* | 3/2011 | Sukekawa | H01L 21/0337 430/312 |
| 2012/0088193 A1* | 4/2012 | Weidman | G03F 7/0752 430/296 |
| 2016/0133563 A1 | 5/2016 | Ai et al. | |
| 2017/0098575 A1* | 4/2017 | Kesapragada | H01L 21/76826 |
| 2017/0148739 A1* | 5/2017 | Roberts | H01L 21/76849 |
| 2018/0012752 A1 | 1/2018 | Tapily | |
| 2019/0316256 A1* | 10/2019 | Bhuyan | H01L 21/3205 |

OTHER PUBLICATIONS

Mouline, Zineb, et al., "Synthesis and characterization of organoamine-functionalized amorphous silica materials for $CO_2$-selective membranes". Journal of the Ceramic Society of Japan, 123 [9] 779-784, 2015.*

Li, Kaimin, et al., "Polyethyleneinnine-nano silica composites: a low cost and promising adsorbent for $CO_2$ capture". J. Mater. Chem. A, 2015, 3, 2166-2175.*

Burton, B.B., et al., "$SiO_2$ Atomic Layer Deposition Using Tris(dimethylamino)silane and Hydrogen Peroxide Studied by in Situ Transmission FTIR Spectroscopy". J. Phys. Chem. C 2009, 113, 8249-8257.*

Hirose, F., et al., "Atomic layer deposition of $SiO_2$ from Tris(dimethylamino)silane and ozone by using temperature-controlled water vapor treatment". Thin Solid Films 519 (2010) 270-275.*

International Search Report and Written Opinion of the Searching Authority, dated Jan. 16, 2020, in corresponding International Patent Application No. PCT/US2019/053660 (12 total pages).

* cited by examiner

METHOD FOR SELECTIVE DEPOSITION USING A BASE-CATALYZED INHIBITOR

FIELD OF THE INVENTION

Implementations of the present disclosure relate to a method for selective deposition using a base-catalyzed inhibitor.

DESCRIPTION OF THE RELATED ART

In the context of semiconductor devices and the fabrication of such devices, metal oxide films are useful as hardmask materials to protect either the dielectric or metallic surfaces during etch processing. In a conventional process, the metal oxide film is deposited over the entire substrate surface, and then selectively removed using lithographic process. However, as device and critical dimension sizes have continued to shrink, the commercial viability of lithography processes has not kept pace. Technologies such as extreme ultraviolet lithography remain cost-prohibitive for high volume manufacturing, thus limiting their widespread adoption for commercial applications. Thus, a problem in the semiconductor industry is the immaturity of lithography technology relative to the rate at which devices and the critical dimension are shrinking.

It is in this context that implementations of the disclosure arise.

SUMMARY

Selective deposition of metal oxide films by atomic layer deposition (ALD) has been demonstrated using silicon amide precursors as inhibiting reagents. Broadly speaking, the silicon amide precursor is used to covalently terminate the dielectric oxide surface, enabling the metal oxide to be selectively deposited on, for example, exposed metallic surfaces. Silicon chloride precursors are typically 10-100 times less expensive than silicon amide precursors, and thus would be desirable for use in high volume manufacturing, but silicon chloride precursors are generally unreactive. However, it has been discovered that the aforementioned selective deposition process by ALD can be extended to include silicon chloride precursors by co-flowing the precursors with a base such as ammonia or water which catalyzes the reaction with the substrate surface.

Implementations of the present disclosure enable patterning at small length scales (e.g. less than 40 nm), through selective deposition of metal oxide films. While such patterning is technically possible with known lithography processes, such processes are cost prohibitive for high volume manufacturing in the commercial setting. However, methods in accordance with implementations of the present disclosure enable selective deposition of metal oxide films using cost-effective chloride-based inhibitors. This enables selective hardmask deposition through chemically achieved selectivity, which obviates the need for a lithography process to pattern the hardmask, thereby avoiding problems inherent to lithography processes such as alignment issues. In sum, implementations of the present disclosure enable cost-effective selective metal oxide deposition suitable for high volume manufacturing applications at dimensions smaller than what is currently commercially attainable.

In accordance with some implementations, a method is provided, including the following operations: simultaneously applying an organosilyl chloride inhibitor and a Lewis base to a surface of a substrate, the organosilyl chloride inhibitor being configured to adsorb onto dielectric regions of the surface of the substrate; performing a plurality of cycles of an ALD process to deposit a metal oxide onto the surface of the substrate; wherein the applying of the organosilyl chloride inhibitor and the Lewis base prevents the ALD process from depositing the metal oxide onto the dielectric regions of the surface of the substrate.

In some implementations, the applying of the organosilyl chloride inhibitor and the Lewis base is configured so that the organosilyl chloride inhibitor chemisorbs onto the dielectric regions of the surface of the substrate.

In some implementations, the chemisorption is defined by reaction of the organosilyl chloride inhibitor with exposed hydroxyl groups of the dielectric regions of the surface of the substrate, so as to form covalent bonds between silicon species of the organosilyl chloride inhibitor and oxygen species of the hydroxyl groups.

In some implementations, the chemisorption is enabled by the applying of the Lewis base to the surface of the substrate, wherein the Lewis base weakens oxygen-hydrogen bonds of the exposed hydroxyl groups to enable the formation of the covalent bonds.

In some implementations, the applying of the organosilyl chloride inhibitor and the Lewis base is defined by simultaneously flowing a vapor of the organosilyl chloride inhibitor and a vapor of the Lewis base over the surface of the substrate.

In some implementations, the flowing of the vapor of the organosilyl chloride inhibitor is at a flow rate of approximately 50 to 150 SCCM for a duration of approximately 5 to 15 seconds.

In some implementations, the flowing of the vapor of the Lewis base is at a flow rate of approximately 50 to 150 SCCM for a duration of approximately 5 to 15 seconds.

In some implementations, the organosilyl chloride inhibitor includes one to three alkyl groups.

In some implementations, each of the alkyl groups includes 1 to 20 carbon atoms.

In some implementations, the organosilyl chloride inhibitor includes one to three chloride groups.

In some implementations, the Lewis base is selected from the group consisting of water and ammonia.

In some implementations, the method is performed at a temperature in the range of approximately 100 to 250 degrees Celsius.

In some implementations, the plurality of cycles of the ALD process is in the range of about 10 to 40 cycles.

In some implementations, a method is provided, including the following method operations: simultaneously applying a vapor of an organosilyl chloride inhibitor and a vapor of a Lewis base to a surface of a substrate, the organosilyl chloride inhibitor being configured to chemisorb onto dielectric regions of the surface of the substrate; performing a plurality of cycles of an ALD process to deposit a metal oxide onto the surface of the substrate; wherein the applying of the organosilyl chloride inhibitor and the Lewis base prevents the ALD process from depositing the metal oxide onto the dielectric regions of the surface of the substrate.

In some implementations, a method is provided, including the following method operations: simultaneously applying a vapor of an organosilyl chloride inhibitor and a vapor of water or ammonia to a surface of a substrate, the organosilyl chloride inhibitor being configured to chemisorb onto dielectric regions of the surface of the substrate; performing a plurality of cycles of an ALD process to deposit a metal oxide onto the surface of the substrate; wherein the applying of the organosilyl chloride inhibitor and the Lewis base prevents the ALD process from depositing the metal oxide onto the dielectric regions of the surface of the substrate.

DETAILED DESCRIPTION

Figure 1A:
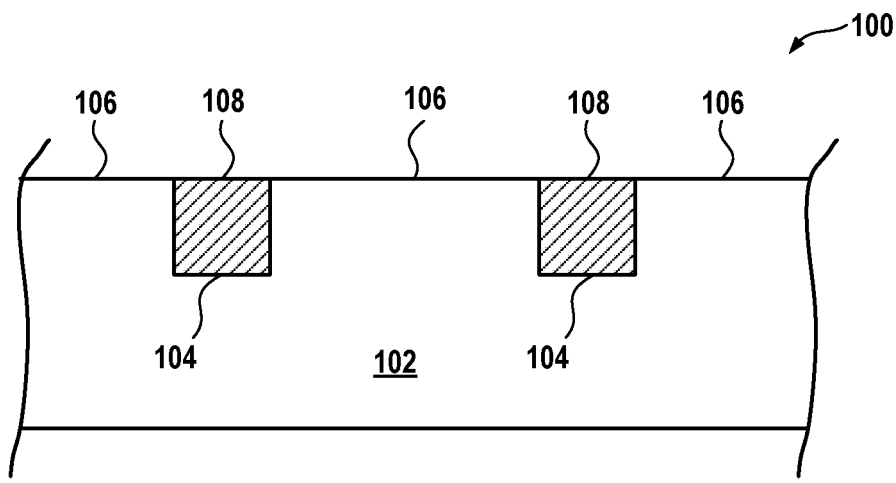
FIGS. 1A, 1B, and 1C conceptually illustrate a method for performing selective deposition of a metal oxide film using an inhibitor, in accordance with implementations of the disclosure.

In the following description, numerous specific details are set forth to provide a thorough understanding of the presented implementations. The disclosed implementations may be practiced without some or all of these specific details. In other instances, well-known process operations have not been described in detail to not unnecessarily obscure the disclosed implementations. While the disclosed implementations will be described in conjunction with the specific implementations, it will be understood that it is not intended to limit the disclosed implementations.

Current selective deposition of metal oxide films has been demonstrated using silicon amide inhibitors to block deposition on dielectric surfaces. These amides tend to be expensive and less volatile than their chloride counterparts. Vapor phase inhibition has been so far unknown using chloride precursors.

Typical ALD dielectric deposition requires a metal organic precursor (tri-methyl-aluminum or tetrakis (dimethylamido) zirconium, for example) and water to deposit a film. The first step in the ALD process is exposure of the metal organic precursor to the surface where native hydroxyls or oxide species react with the precursor to form surface-oxygen-metal bonds displacing one of the metal organic ligands as either an amine (e.g. $HN(CH_3)_2$) or as a hydrocarbon (e.g. $CH_4$). A method to block deposition on a surface is to eliminate these reactive hydroxyls/oxides (surface —OH or surface =O) and replace them with hydrocarbon termination (surface —$C_xH_y$). Regents such as silicon amides (e.g. $Si(CH_3)_3(NMe_2)$) can be used to perform this task.

Chloride analogs of these silicon amide precursors are intrinsically less expensive (in fact, such chlorides form the starting material for their amide counterparts) and are typically more volatile. Due to the poor basicity of the chloride ligand (—Cl) relative to the amide ligand (—NR2), the chloride precursors tend to be unreactive toward hydroxyl terminated surfaces (—OH). However, by co-flowing the precursor with a volatile base such as ammonia or water vapor, this reaction occurs readily (e.g. at time scales on the order of seconds) and at low temperatures (e.g. <200 C). The enablement of chloride precursors for selective processing is a significant innovation that provides a commercially viable method for selective metal oxide deposition to enable next generation technology nodes.

A process for selective metal oxide deposition begins with an incoming substrate (e.g. wafer). An inhibitor is deposited on the surface of the substrate that selectively adsorbs onto specific surfaces of the substrate, such as oxide surfaces or metallic surfaces. This is followed by a deposition process (e.g. ALD), that then only deposits on the surface which has not been blocked. The adsorbed inhibitor acts as a blocking agent to prevent deposition on specific surfaces. Different kinds of inhibitors can be utilized depending upon what surface is desired to be blocked. For example, if the goal is blocking a metal surface, e.g. copper or tungsten, then a thiol molecule can be used (e.g. ethane-thiol, butane-thiol, or longer alkyl chains attached to sulfur group). For blocking dielectric surfaces, which typically have termination with a hydroxyl group (OH), precursors with silicon chlorides or silicon amides are good at reacting and forming covalent bonds on those surfaces.

Figure 1B:
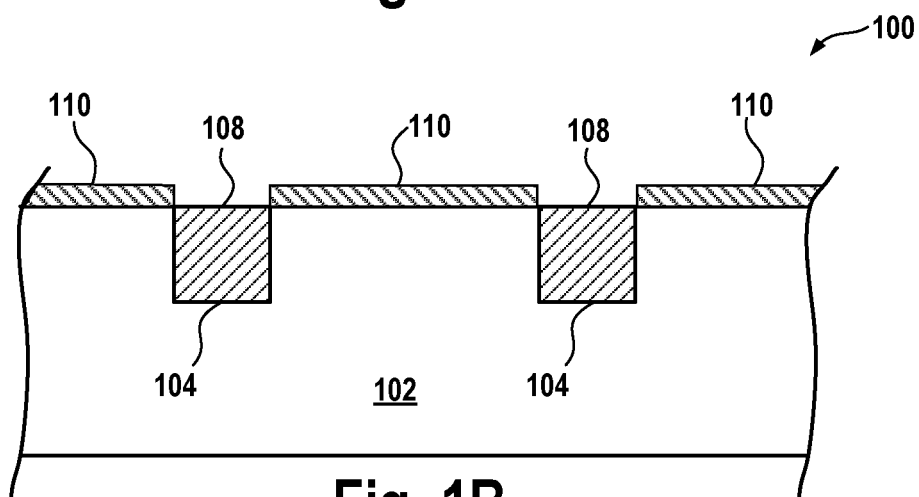
Figure 1C:
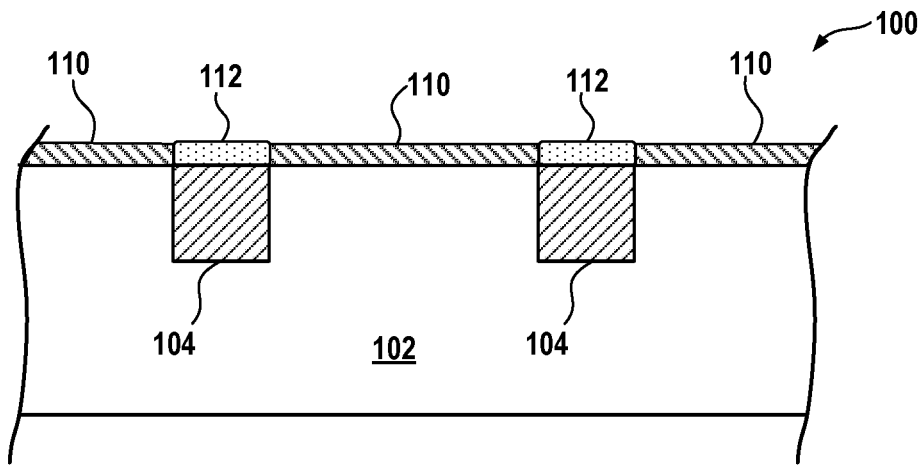

FIGS. 1A, 1B, and 1C conceptually illustrate a method for performing selective deposition of a metal oxide film using an inhibitor, in accordance with implementations of the disclosure. Shown at FIG. 1A is a cross-section view of a substrate 100. The substrate 100 includes a dielectric layer 102 (e.g. an oxide such as $SiO_2$) and metallic features 104. The resulting surface structure of the substrate 100 thus exhibits dielectric surface regions 106 and metallic surface regions 108.

As shown at FIG. 1B, an inhibitor is selectively deposited on the dielectric surface regions of the substrate surface, so as to form inhibitor layers 110. The inhibitor layers 110 block deposition of a metal oxide on the underlying dielectric portions of the substrate.

At FIG. 1C, a metal oxide is deposited on the substrate 100. Because of the presence of the inhibitor layers, the metal oxide is prevented from being deposited on the dielectric layer 102, and selectively deposits only on the metallic surface regions 108 of the substrate, forming the metal oxide layers 112 selectively on the metallic features 104. In this manner, the metal oxide layers 112 can selectively protect the underlying metallic features 104, for example, during subsequent etch processing.

In some implementations, the metal oxide is deposited by an atomic layer deposition (ALD) process. In other implementations, the metal oxide is deposited by another process, such as chemical vapor deposition (CVD), or a solution-based process.

Suitable inhibitors for blocking metal oxide deposition include organosilicon compounds. For example, organosilicon compounds having one or more alkyl groups are suitable inhibitors, for when chemisorbed (by covalent bonding) onto the dielectric surfaces, the exposed alkyl groups render these regions relatively non-reactive, so that the subsequent ALD process does not deposit over them. It will be appreciated that for purposes of the present disclosure, the inhibitor is a molecular precursor that is applied to the substrate surface, and that selectively adsorbs (e.g. reacts to form covalent bonds) onto the dielectric surface regions of the substrate.

By way of example without limitation, silicon amide precursors having organic groups have been demonstrated to be effective inhibitors. Examples of such silicon amide precursors may have one to three amine or organoamine groups (e.g. dimethylamino groups), and the remaining coordination sites on the silicon (Si) can be alkyl groups (e.g. linear or branched hydrocarbon chains including, for example, methyl, ethyl, propyl, butyl, etc.).

Figure 2A:
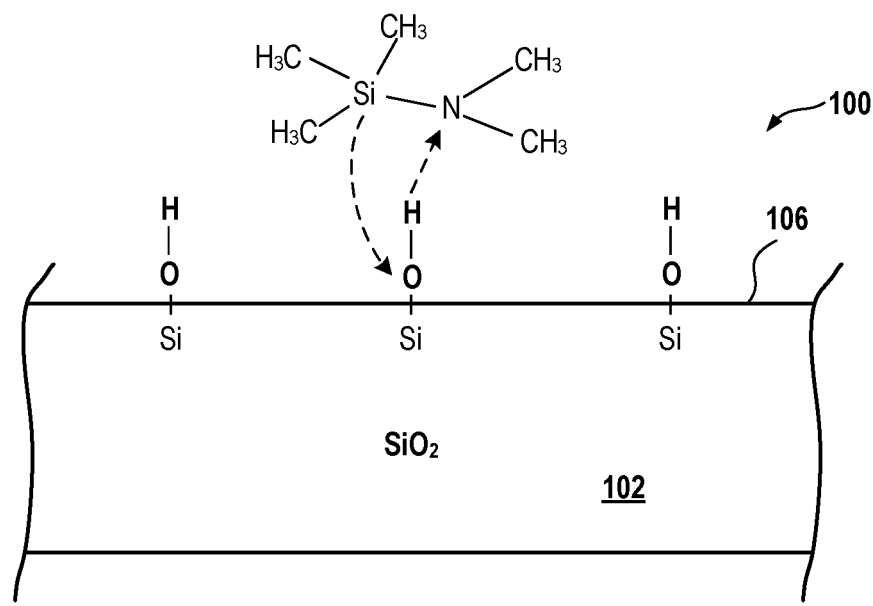
FIGS. 2A and 2B conceptually illustrate a mechanism for the adsorption of a silicon amide precursor onto a dielectric surface, in accordance with implementations of the disclosure.
Figure 2B:
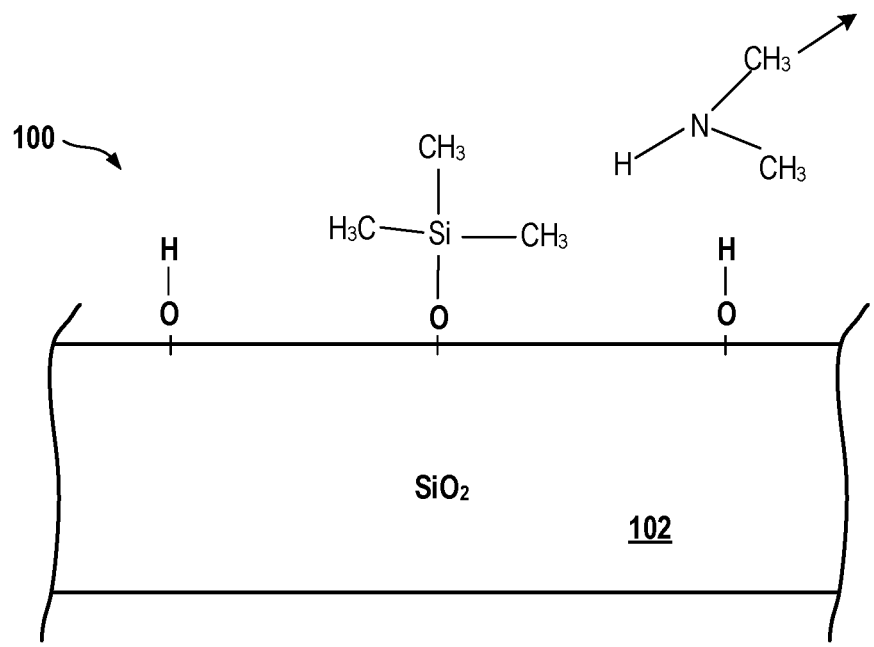

FIGS. 2A and 2B conceptually illustrate a mechanism for the adsorption of a silicon amide precursor onto a dielectric surface, in accordance with implementations of the disclosure. As shown at FIG. 2A, the dielectric surface region 106 of the substrate 100 includes exposed —OH groups. In the illustrated implementation, dimethylamino trimethyl silane is provided as the inhibitor. Without being bound by any particular theory of operation, it is believed that the mechanism of adsorption, as shown, is that the silicon on the dimethylamino trimethyl silane inhibitor interacts with a hydroxyl group on the surface, and shifts to an expanded coordination sphere (5 coordinate) in which the silicon on the inhibitor is connected to the oxygen on the surface, and the hydrogen on the hydroxyl group is transferred to the nitrogen on the dimethylamino group, and leaves as dimethylamine ($HN(CH_3)_2$). As illustrated at FIG. 2B, the resulting product at the surface is a silicon-oxygen-silicon linkage that covalently attaches the trimethyl silane group, which is useful to prevent future deposition of a metal oxide on the dielectric surface region.

In a similar manner to that described above using silicon amide precursors, so also silicon chloride precursors may be considered for use as inhibitors to metal oxide deposition. A silicon chloride precursor would typically have one to three chlorines, and the remaining coordination sites on the Si would be alkyl groups. In theory, a mechanism of adsorption ought to be similar. That is, the silicon on the silicon chloride inhibitor molecule will interact with a hydroxyl on the surface of the substrate, and shift to a 5-coordinate expanded coordination sphere with the silicon connected to the oxygen on the surface. And the hydrogen on the hydroxyl group ought to be transferred to one of the chlorines, and leave as hydrogen chloride (HCl). In both cases of silicon amide precursors or silicon chloride precursors as inhibitors, the resulting product is a covalently attached silicon-based inhibitor, having silicon-oxygen-silicon linkage which links the inhibitor to the surface.

Now in the case of silicon amide precursors, the thermodynamics strongly favor the above-described mechanism, as the hydrogen is being transferred from an oxygen to a nitrogen. One way to conceptualize this is using acid-base theory, from which it will be understood that nitrogen is much more basic than oxygen, so that it is naturally thermodynamically favorable for hydrogen to transfer from an oxygen to a nitrogen species.

However, in the case of the mechanism for a silicon chloride precursor which leads to a chloride leaving group, the thermodynamics are unfavorable, because transference of a hydrogen from an oxygen to a chlorine is not favorable.

However, in accordance with implementations of the disclosure, the addition of base in this system weakens the oxygen-hydrogen bond on the surface to facilitate the transfer of the hydrogen from the oxygen to the chlorine. This produces a net thermodynamically favorable reaction.

Figure 3A:
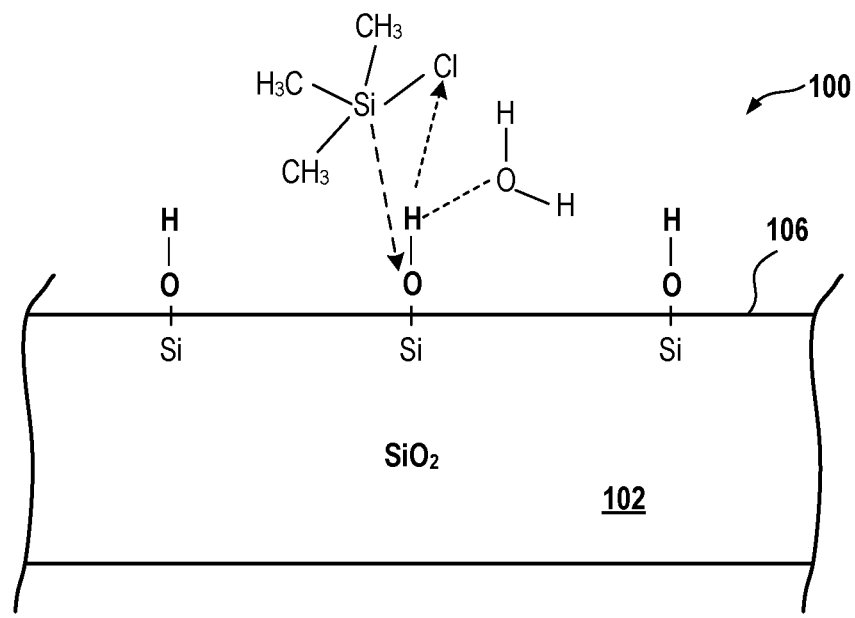
FIGS. 3A and 3B conceptually illustrate a mechanism for the adsorption of a silicon chloride precursor onto a dielectric surface, in accordance with implementations of the disclosure.
Figure 3B:
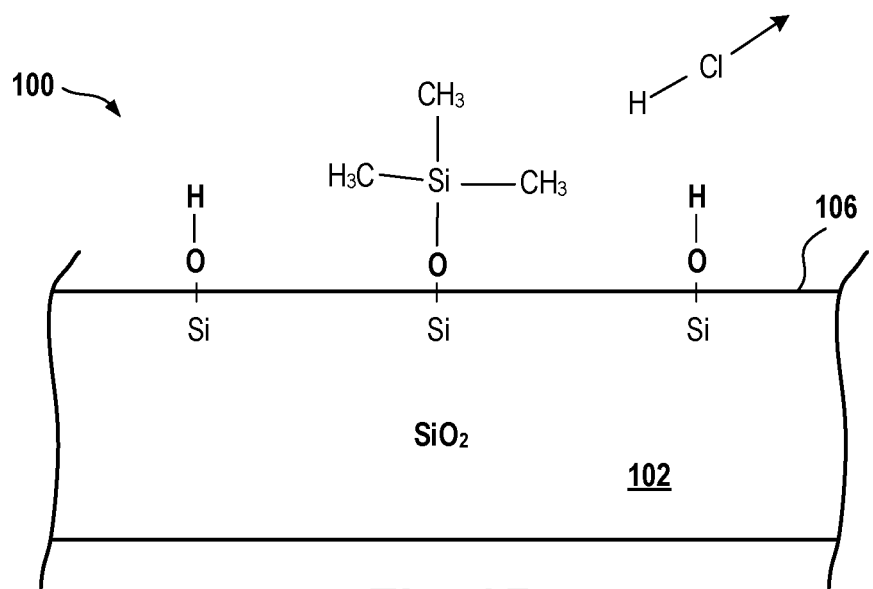

FIGS. 3A and 3B conceptually illustrate a mechanism for the adsorption of a silicon chloride precursor onto a dielectric surface, in accordance with implementations of the disclosure. As shown at FIG. 3A, the dielectric surface region 106 of the substrate 100 includes exposed —OH groups. In the illustrated implementation, trimethylchlorosilane is provided as the inhibitor and water ($H_2O$) is also provided as a Lewis base in the system.

Without being bound by any particular theory of operation, it is believed that the mechanism of adsorption is as shown. The oxygen on the water molecule attracts the hydrogen of the hydroxyl group, weakening the hydroxyl's O—H bond. The silicon on the trimethylchlorosilane inhibitor interacts with the hydroxyl group on the surface, and shifts to an expanded 5-coordinate coordination sphere in which the silicon on the inhibitor is connected to the oxygen on the surface. With the O—H bond having been weakened, then the hydrogen on the hydroxyl group is transferred to the chlorine, which leaves as hydrogen chloride (HCl). As illustrated at FIG. 3B, the resulting product at the surface is again a silicon-oxygen-silicon linkage that covalently attaches the trimethyl silane group, which is useful to prevent deposition of a metal oxide in this region of the substrate by a subsequent deposition process.

As described above, in some implementations, water is provided as the base. In other implementations, other Lewis bases can be applied. In some implementations, any Lewis base that is capable of weakening the OH bond and promoting covalent bonding of the inhibitor to the dielectric surface as described above can be applied. Furthermore, in some implementations, the process is a vapor phase process, and therefore in such implementations, the base is also volatile or capable of being volatilized (either with or without a carrier gas (e.g. inert gas such as $N_2$, argon, etc.) at the chosen process temperature.

In some implementations, ammonia is utilized as the base to weaken the surface OH bonds. In this case, rather than forming HCl as the leaving group as described above with water, use of ammonia results in formation of ammonium chloride as the leaving group, which is thermodynamically quite favorable.

In some implementations, the base is a volatile amine. Non-limiting examples include the following: methylamine, dimethylamine, ethylamine, trimethylamine, isopropylamine, ethylmethylamine, tert butylamine, n-propylamine, diethylamine, sec butylamine, n-butylamine, ethylenediamine, ethanolamine, triethylamine, pyridine, 1,3-diaminopropane, piperidine, morpholine, methylaminopropylamine, dimethylaminopropylamine, tetramethylendiamine, phenylethylamine, etc.

Broadly speaking, the inhibitor can be any organosilyl chloride precursor having the generic formula of $SiR_xCl_{4-x}$ where R is an alkyl group, x is 1, 2, or 3. Alkyl groups can be linear (e.g. methyl, ethyl, propyl, butyl, etc.) or branched (isopropyl, t-butyl, etc.).

Non-limiting examples of such inhibitors include the following: methyltrichlorosilane, dimethyldichlorosilane, trimethylchlorosilane, ethyltrichlorosilane, diethyldichlorosilane, triethylchlorosilane, propyltrichlorosilane, dipropyldichlorosilane, tripropylchlorosilane, butyltrichlorosilane, dibutyldichlorosilane, tributylchlorosilane, pentyltrichlorosilane, dipentyldichlorosilane, tripentylchlorosilane, hexyltrichlorosilane, dihexyldichlorosilane, trihexylchlorosilane, heptyltrichlorosilane, diheptyldichlorosilane, triheptylchlorosilane, octyltrichlorosilane, dioctyldichlorosilane, trioctylchlorosilane, nonyltrichlorosilane, dinonyldichlorosilane, trinonylchlorosilane, decyltrichlorosilane, didecyldichlorosilane, tridecylchlorosilane, undecyltrichlorosilane, diundecyldichlorosilane, triundecylchlorosilane, dodecyltrichlorosilane, didodecyldichlorosilane, tridodecylchlorosilane, etc. The foregoing listed examples contain linear alkyl groups. However, it will be appreciated that in other examples, the alkyl groups may be branched.

Generally speaking, there are trade-offs depending upon the length of the alkyl chains. For example, longer alkyl chains enable a single molecule to block more of the surface region, and generally also enable the inhibitor to survive more deposition cycles once adsorbed on the substrate surface. However, inhibitors with longer alkyl chains may tend to provide less complete surface coverage (for a given duration of exposure) because the longer alkyl chains may render the molecule bulky and more difficult to pack efficiently to avoid gaps in coverage. Also, inhibitors with longer alkyl chains will tend to be less volatile, making them more difficult to use in a vapor phase process (e.g. may require higher temperatures and/or the use of a carrier gas).

It will be appreciated that a solution phase process can be conducive to utilizing inhibitors having longer alkyl chains, because it is simpler to allow more time for inhibitor molecules to be seated at the surface, and volatility is not required.

Implementations of the present disclosure thus enable the use of silicon chloride precursors as inhibitors to metal oxide deposition, by use of a catalyst. Results can be obtained comparable to those of silicon amide precursors, but at significantly reduced cost. Chloride precursors are generally unfavorable in research and development applications because they produce HCl which is fairly toxic and can be corrosive to equipment, and because the cost difference is fairly negligible for small quantities. And if simply tried both amides and chlorides without utilizing a catalyst as described herein, one would tend to obtain better results with the amides.

But for high volume manufacturing applications, enabling the use of chlorine precursors provides a significant advantage by reducing raw material cost. In general, silicon amide precursors are actually manufactured starting from a chloride based silicon precursor, in which chlorine is substituted out for an amide. Thus, the chloride based precursor is significantly less expensive when utilized at commercial scale.

Also, equipment can be constructed to withstand and/or handle chlorine based gases. For example, a reactor may have a liner or precoat of another film to passivate metal surfaces within the reactor to prevent HCl from corroding them. Also, scrubbers and exhaust systems can be employed to handle chloride gases.

Another advantage of using chloride precursors is that they are more volatile than the corresponding amide precursors. This provides a wider selection of molecules that have higher vapor pressure, which can be utilized to enable vapor phase processes.

It will be appreciated that in general, whether a chloride or amide precursor is used as the inhibitor, there is no functional difference in terms of the final product. For once the inhibitor has been adsorbed (by chemisorption), the chloride/amide groups are no longer present as they are removed as part of the covalent bonding process.

Figure 4:
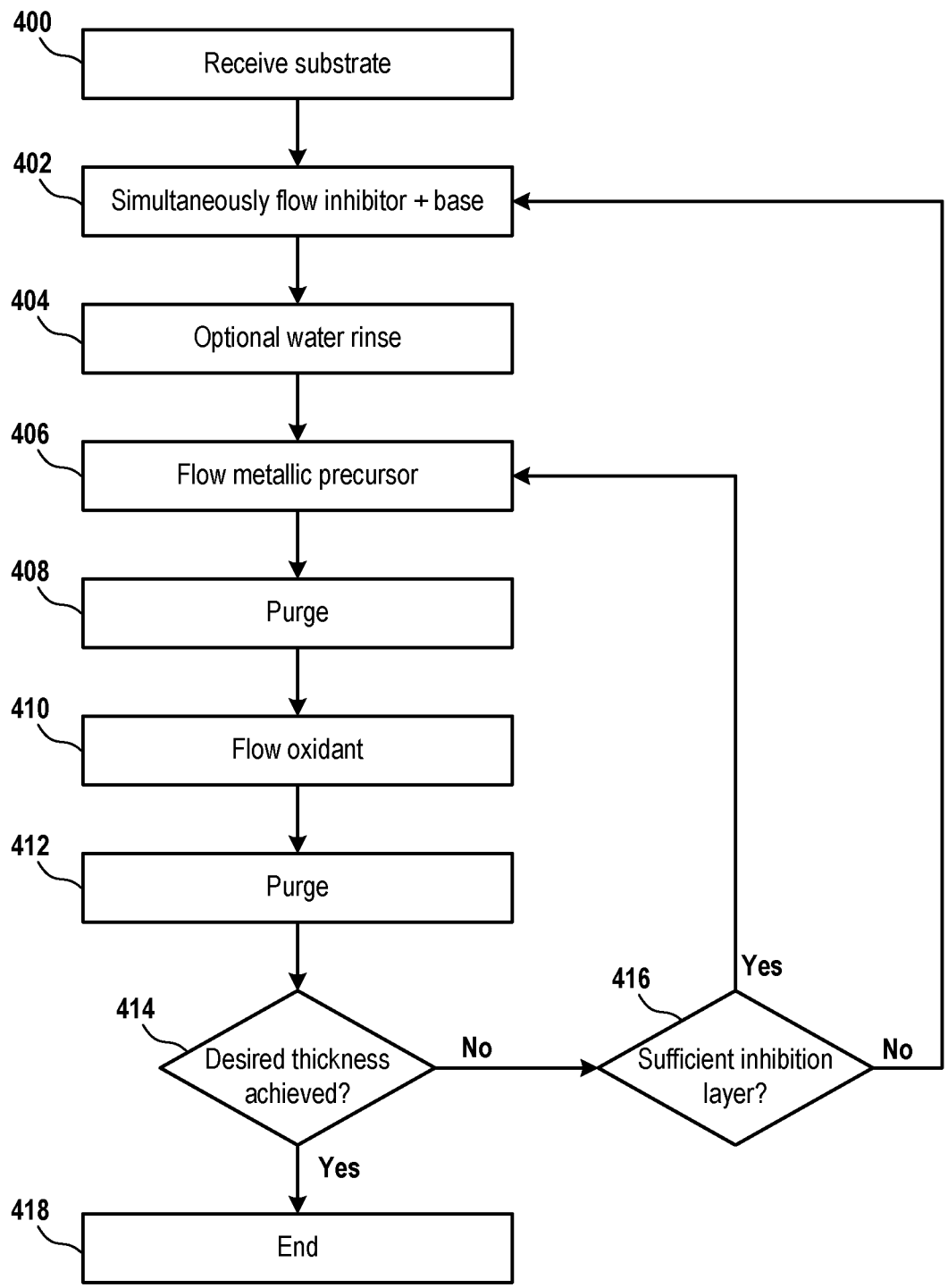
FIG. 4 illustrates a method for selectively depositing a metal oxide on non-dielectric (non-oxide) surfaces of a substrate, in accordance with implementations of the disclosure.

FIG. 4 illustrates a method for selectively depositing a metal oxide on non-dielectric (non-oxide) surfaces of a substrate, in accordance with implementations of the disclosure. At method operation 400, a substrate is received into a process chamber. At method operation 402, an inhibitor and a base are simultaneously flowed into the process chamber and over the substrate surface. As described elsewhere herein, the base catalyzes adsorption of the inhibitor onto the oxide/dielectric surfaces of the substrate by covalent bonding.

In some instances, the inhibitor may also adsorb to a certain extent onto non-oxide/non-dielectric surfaces (though not adhered by covalent bonding), such as exposed metallic surfaces. Therefore, in some implementations, an optional water rinse is performed at method operation 404, which serves to remove any remaining inhibitor that may have adsorbed onto the exposed metallic surfaces.

Following either of method operation 402 and/or method operation 404, the process chamber can be purged with an inert gas.

Additionally, in some implementations, method operation 402 can be repeated for a predefined number of cycles, so that the dosing of the inhibitor and base catalyst is repeated to improve coverage and/or thickness of the inhibition layer, so that it may subsequently survive and enable persistent selectivity for a greater number of ALD cycles.

Following this, an atomic layer deposition (ALD) process is performed to selectively deposit a metal oxide. The method operations 406, 408, 410, and 412, define a single cycle of an ALD process. At method operation 406, a metallic precursor is flowed into the process chamber. It will be appreciated that because of the chemisorption of the inhibitor onto the dielectric surfaces, the metallic precursor is blocked from depositing onto the dielectric. And therefore, the metallic precursor is selectively deposited on the exposed metallic surfaces. At method operation 408, the process chamber is purged, e.g. by flowing an inert gas through the process chamber. At method operation 410, an oxidant is flowed into the process chamber, converting the depositing metallic precursor to the metal oxide. At method operation 412, the process chamber is again purged, e.g. by flowing an inert gas through the process chamber.

At method operation 414, it is determined whether a desired thickness of the metal oxide has been achieved. This may be determined based on reaching a total predefined number of deposition cycles, or through empirical testing, including in-situ monitoring. If the desired thickness has been achieved (or if the total predefined number of deposition cycles has been reached), then the method ends at operation 418.

If the desired thickness has not been achieved yet (or if the total predefined number of deposition cycles has been reached), then at method operation 416, it is determined whether there is still a sufficient inhibition layer remaining for another deposition cycle. That is, it is determined whether the inhibition layer formed from the inhibitor chemisorption is still sufficiently intact to provide suitable inhibition of the metal oxide deposition on the dielectric, so that the desired selectivity of the ALD metal oxide deposition will be achieved in the next cycle. This may entail determining whether a predefined number of cycles of the ALD process since the last deposition of the inhibitor has been.

If there is still a sufficient inhibition layer (or if the predefined number of ALD cycles since the last inhibitor deposition has not been reached), then the method returns to method operation 406 to initiate another ALD cycle. Whereas if there is not a sufficient inhibition layer (of if the predefined number of ALD cycles since the last inhibitor deposition has been reached), then the method returns to method operation 402 to deposit the inhibitor again.

It will be appreciated that the inhibitor can be applied prior to each ALD cycle or at some frequency (e.g. at the beginning, and thereafter, after every nth deposition cycle).

Factors such as the efficacy of the inhibitor, how well it adheres to the dielectric surface, and how well it survives the ALD process can be used to determine how frequently the inhibitor should be replenished. Ideally, for purposes of process speed and throughput, it is desirable to apply the inhibitor at the lowest frequency possible. It will be appreciated that following application of an inhibitor, the point at which the selectivity of the ALD process breaks down will vary depending upon the film and inhibitor system. In some implementations, the inhibitor can be expected to last between 10 and 40 ALD cycles.

Figure 5:
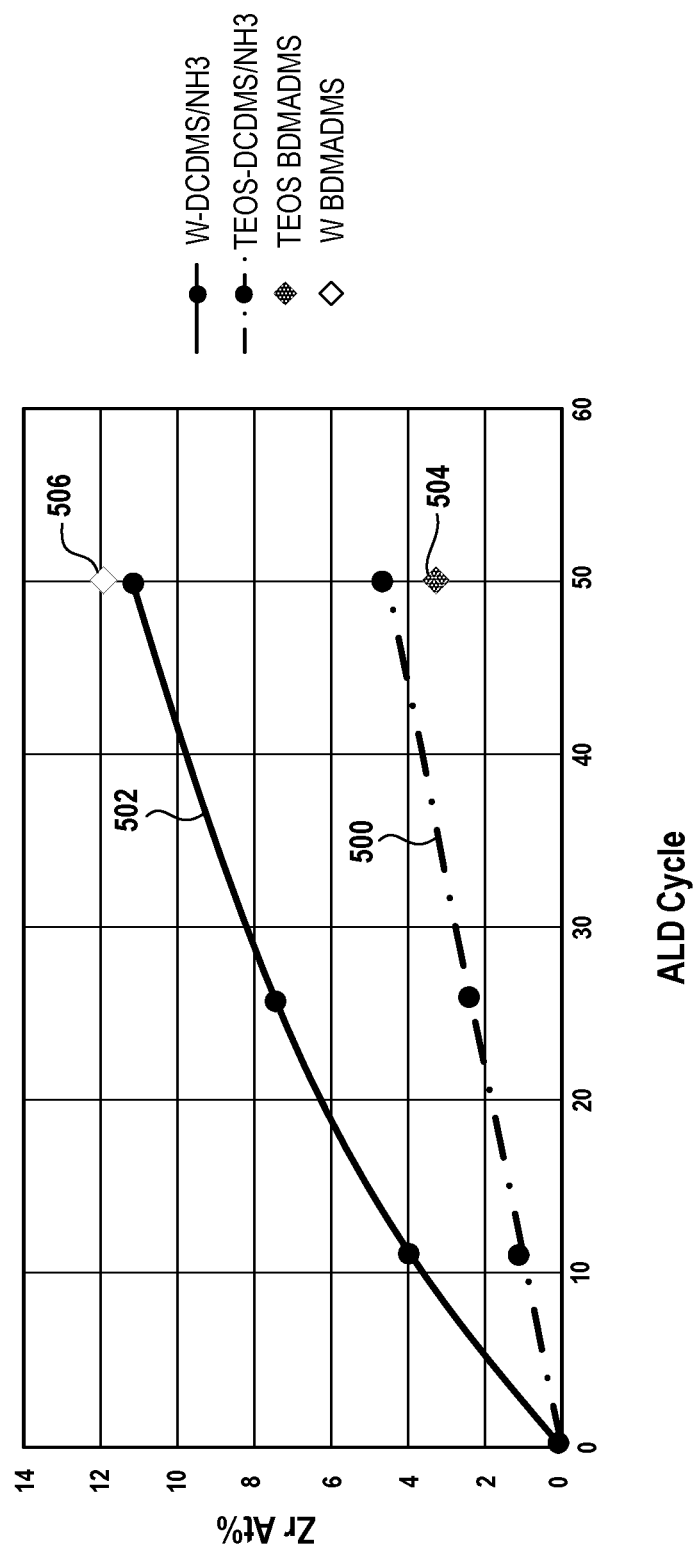
FIG. 5 is a graph illustrating results employing a silicon chloride and a silicon amide as inhibitors to subsequent zirconium (Zr) deposition by ALD, in accordance with implementations of the disclosure.

FIG. 5 is a graph illustrating results employing a silicon chloride and a silicon amide as inhibitors to subsequent zirconium (Zr) deposition by ALD, in accordance with implementations of the disclosure. Dichlorodimethylsilane (DCDMS) and ammonia ($NH_3$) were co-flowed on to $SiO_2$ and tungsten surfaces, and followed by zirconium deposition by ALD for various numbers of cycles. The extent of zirconium deposition was measured by X-ray photoelectron spectroscopy (XPS), and thus the illustrated graph shows the atomic percentage of Zr versus the number of ALD cycles.

The curve 500 illustrates atomic percentage of Zr versus number of ALD cycles on a $SiO_2$ surface treated with DCDMS and ammonia. The curve 502 shows the results for a tungsten (W) surface with the same treatment. As can be seen, the Zr deposition is selective for the tungsten surface, demonstrating the inhibition effect of the DCDMS+$NH_3$ treatment. Generally speaking, as the number of ALD cycles increases, so the selectivity is diminished, which is to be expected since the inhibition effect decreases as the inhibitor coating wears off with increasing numbers of deposition cycles.

Also shown in the illustrated graph are results using an amide analog, namely bis-dimethylamidodimethylsilane (BDMADMS) as an inhibitor. The data point 504 shows the atomic percentage of Zr for a SiO2 surface treated with BDMADMS and 50 cycles of Zr ALD. Whereas the data point 506 shows the atomic percentage of Zr for a tungsten surface having the same treatment. As can be seen, the results at 50 cycles of Zr ALD are largely similar between the BDMADMS treatment and the DCDMS/$NH_3$ treatment, thus demonstrating the viability of the chloride inhibitor that is enabled by base catalyzation, in this case using ammonia.

The specific parameters of the inhibitor deposition may vary depending upon the particular inhibitor being used and the nature of the substrate and deposition system, and therefore the following deposition parameters are provided by way of example, and without limitation. In some implementations, the inhibitor is deposited at a process temperature in the range of about 100 to 250 C. In some implementations, the process temperature is in the range of about 150 to 200 C. Broadly speaking, for a vapor phase process, the inhibitor deposition can be carried out at a temperature sufficient to maintain the volatility of the inhibitor and the base catalyst. Therefore, no carrier gas is needed because the inhibitor and base catalyst have sufficient volatility. However, as noted previously, in some implementations, for example using heavier inhibitors that may be less volatile, then a carrier gas may also be flowed with the inhibitor and base catalyst.

In some implementations, the dosing of the inhibitor consists of a flow in the range of about 50 to 150 sccm for a duration of time in the range of about 5 to 15 seconds, at a chamber/reactor pressure in the range of about 2 to 3 Torr. In some implementations, the flow rate is approximately 100 sccm, and/or the duration is approximately 10 seconds.

In some implementations, the simultaneous dosing of the base catalyst (e.g. water or ammonia) is defined by co-flowing at similar flow parameters to that of the inhibitor, so that the partial volume is similar. That is, the base catalyst is provided at a flow rate in the range of about 50 to 150 sccm for a duration of time in the range of about 5 to 15 seconds, at a chamber/reactor pressure in the range of about 2 to 3 Torr.

Generally, the use of a chloride inhibitor as described herein can be applied to provide selectivity for any metal oxide ALD process utilizing a fairly benign oxidant (e.g. water) that does not effect removal of the inhibition layer prematurely. Non-limiting examples of such metal oxides include oxides of Ti, W, Hf, Zr, or any other transition metal.

Figure 6:
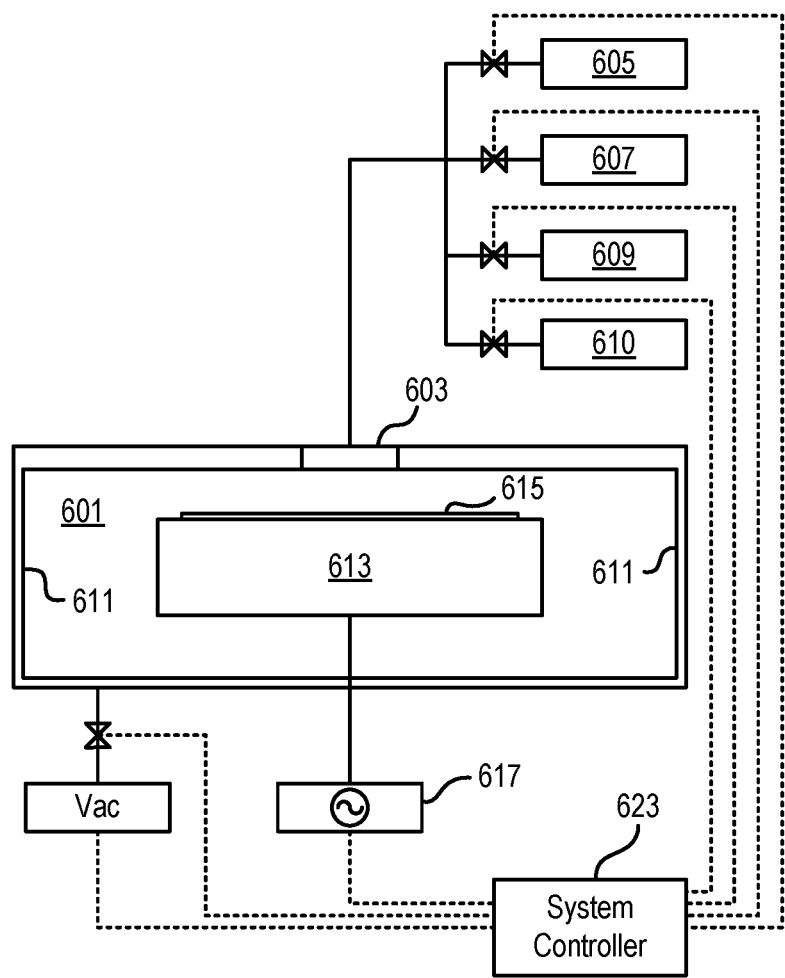
FIG. 6 conceptually illustrates an example process system or apparatus, in which methods of the present disclosure may be performed, in accordance with implementations of the disclosure.

With reference to FIG. 6, an example process system or apparatus, in which methods of the present disclosure may be performed, may include the following: a chamber 601 having a showerhead/injector or nozzle 603 for distributing process gases, such as inhibitor vapor (ref. 605), ALD metallic precursor (ref. 1607), ALD oxidant (ref. 609), inert gas (ref. 610) or other chemistries to the chamber 601; chamber walls 611; a chuck 613 for holding a substrate or wafer 615 to be processed which may include electrostatic electrodes for chucking and dechucking a wafer. The chuck 613 is heated for thermal control, enabling heating of the substrate 615 to a desired temperature.

In some implementations, the system can be configured to generate or receive a plasma in the chamber 601, e.g. for chamber cleaning or for performing plasma enhanced ALD. In some implementations, the chuck 613 may be electrically charged using an RF power supply 1617 to provide a bias voltage (e.g. at a voltage in the range of approximately 20 to 200V, 13.56 Mhz). In various implementations, the chamber walls 611 may be configured to be corrosion-resistant. For example, the chamber walls 611 may be coated with silicon-containing material (such as silicon or silicon oxide) or carbon-containing material (such as diamond) or combinations thereof such that corrosive gases such as halide-containing gases and/or plasma may not etch the chamber walls 611. In some implementations, a plasma may be used for removing metal, metal halide, or metal oxide residues. In some implementations, the chamber walls are heated, for example, to support wall cleaning efficiency with said plasma. In some implementations, the system may include more than one chamber, each of which may be used to process substrates.

The system further includes a system controller 623 for controlling some or all of the operations of the chamber or apparatus such as modulating the chamber pressure, reactive gas flow, inert gas flow, bias power, temperature, vacuum settings, plasma power, plasma frequency; and other process conditions.

Figure 7:
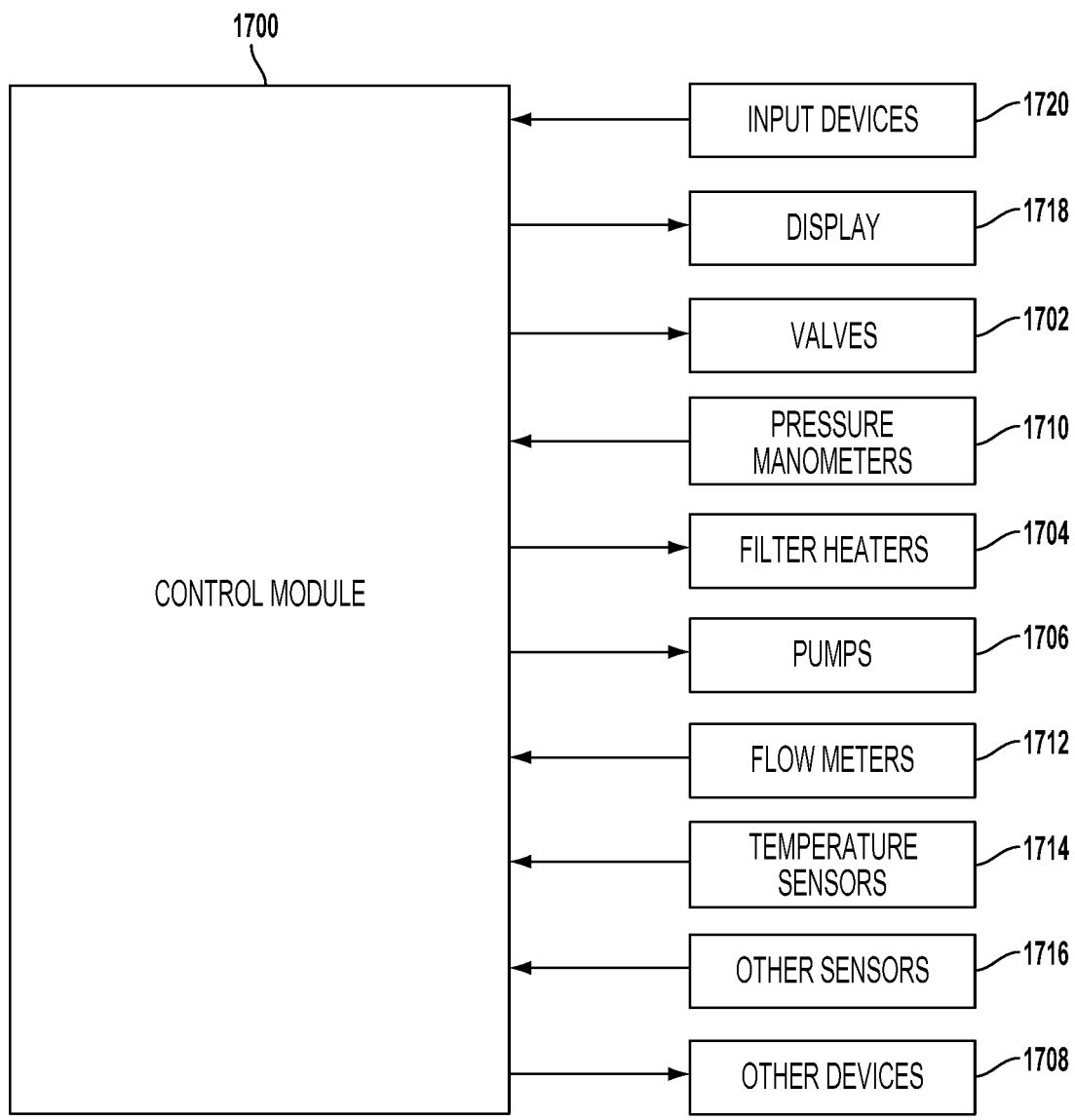
FIG. 7 illustrates a control module for controlling the systems described above, in accordance with implementations of the disclosure.

FIG. 7 shows a control module 700 for controlling the systems described above, in accordance with implementations of the disclosure. For instance, the control module 700 may include a processor, memory and one or more interfaces. The control module 700 may be employed to control devices in the system based in part on sensed values. For example only, the control module 700 may control one or more of valves 702, filter heaters 704, pumps 706, and other devices 708 based on the sensed values and other control parameters. The control module 700 receives the sensed values from, for example only, pressure manometers 710, flow meters 712, temperature sensors 714, and/or other sensors 716. The control module 700 may also be employed to control process conditions during reactant delivery and substrate processing. The control module 700 will typically include one or more memory devices and one or more processors.

The control module 700 may control activities of the reactant delivery system and substrate processing apparatus. The control module 700 executes computer programs including sets of instructions for controlling process timing, delivery system temperature, pressure differentials across the filters, valve positions, mixture of gases, chamber pressure, chamber temperature, wafer temperature, RF power levels, wafer ESC or pedestal position, and other parameters of a particular process. The control module 700 may also monitor the pressure differential and automatically switch vapor reactant delivery from one or more paths to one or more other paths. Other computer programs stored on memory devices associated with the control module 700 may be employed in some implementations.

Typically there will be a user interface associated with the control module 700. The user interface may include a display 718 (e.g. a display screen and/or graphical software displays of the apparatus and/or process conditions), and user input devices 720 such as pointing devices, keyboards, touch screens, microphones, etc.

Computer programs for controlling delivery of reactant, plasma processing and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

Although the foregoing implementations have been described in some detail for purposes of clarity of understanding, it will be apparent that certain changes and modifications may be practiced within the scope of the disclosed implementations. It should be noted that there are many alternative ways of implementing the processes, systems, and apparatus of the present implementations. Accordingly, the present implementations are to be considered as illustrative and not restrictive, and the implementations are not to be limited to the details given herein.

What is claimed is:

1. A method, comprising:
    simultaneously applying an organosilyl chloride inhibitor and a Lewis base to a surface of a substrate, the organosilyl chloride inhibitor being configured to adsorb onto dielectric regions of the surface of the substrate;
    performing a plurality of cycles of an ALD process to deposit a metal oxide onto the surface of the substrate;
    wherein the applying of the organosilyl chloride inhibitor and the Lewis base prevents the ALD process from depositing the metal oxide onto the dielectric regions of the surface of the substrate.

2. The method of claim 1, wherein the applying of the organosilyl chloride inhibitor and the Lewis base is configured so that the organosilyl chloride inhibitor chemisorbs onto the dielectric regions of the surface of the substrate.

3. The method of claim 2, wherein the chemisorption is defined by reaction of the organosilyl chloride inhibitor with exposed hydroxyl groups of the dielectric regions of the surface of the substrate, so as to form covalent bonds between silicon species of the organosilyl chloride inhibitor and oxygen species of the hydroxyl groups.

4. The method of claim 3, wherein the chemisorption is enabled by the applying of the Lewis base to the surface of the substrate, wherein the Lewis base weakens oxygen-hydrogen bonds of the exposed hydroxyl groups to enable the formation of the covalent bonds.

5. The method of claim 1, wherein the applying of the organosilyl chloride inhibitor and the Lewis base is defined by simultaneously flowing a vapor of the organosilyl chloride inhibitor and a vapor of the Lewis base over the surface of the substrate.

6. The method of claim 5, wherein the flowing of the vapor of the organosilyl chloride inhibitor is at a flow rate of approximately 50 to 150 SCCM for a duration of approximately 5 to 15 seconds.

7. The method of claim 5, wherein the flowing of the vapor of the Lewis base is at a flow rate of approximately 50 to 150 SCCM for a duration of approximately 5 to 15 seconds.

8. The method of claim 1, wherein the organosilyl chloride inhibitor includes one to three alkyl groups.

9. The method of claim 8, wherein each of the alkyl groups includes 1 to 20 carbon atoms.

10. The method of claim 1, wherein the organosilyl chloride inhibitor includes one to three chloride groups.

11. The method of claim 1, wherein the Lewis base is selected from the group consisting of water and ammonia.

12. The method of claim 1, wherein the method is performed at a temperature in the range of approximately 100 to 250 degrees Celsius.

13. The method of claim 1, wherein the plurality of cycles of the ALD process is in the range of about 10 to 40 cycles.

14. A method, comprising:
    simultaneously applying a vapor of an organosilyl chloride inhibitor and a vapor of a Lewis base to a surface of a substrate, the organosilyl chloride inhibitor being configured to chemisorb onto dielectric regions of the surface of the substrate;
    performing a plurality of cycles of an ALD process to deposit a metal oxide onto the surface of the substrate;
    wherein the applying of the organosilyl chloride inhibitor and the Lewis base prevents the ALD process from depositing the metal oxide onto the dielectric regions of the surface of the substrate.

15. The method of claim 14, wherein the chemisorption is defined by reaction of the organosilyl chloride inhibitor with exposed hydroxyl groups of the dielectric regions of the surface of the substrate, so as to form covalent bonds between silicon species of the organosilyl chloride inhibitor and oxygen species of the hydroxyl groups.

16. The method of claim 15, wherein the chemisorption is enabled by the applying of the Lewis base to the surface of the substrate, wherein the Lewis base weakens oxygen-hydrogen bonds of the exposed hydroxyl groups to enable the formation of the covalent bonds.

17. The method of claim 14,
wherein the flowing of the vapor of the organosilyl chloride inhibitor is at a flow rate of approximately 50 to 150 SCCM for a duration of approximately 5 to 15 seconds;
wherein the flowing of the vapor of the Lewis base is at a flow rate of approximately 50 to 150 SCCM for a duration of approximately 5 to 15 seconds.

18. The method of claim 14,
wherein the organosilyl chloride inhibitor includes one to three alkyl groups;
wherein each of the alkyl groups includes 1 to 20 carbon atoms.

19. A method, comprising:
simultaneously applying a vapor of an organosilyl chloride inhibitor and a vapor of water or ammonia to a surface of a substrate, the organosilyl chloride inhibitor being configured to chemisorb onto dielectric regions of the surface of the substrate;
performing a plurality of cycles of an ALD process to deposit a metal oxide onto the surface of the substrate;
wherein the applying of the organosilyl chloride inhibitor and the water or ammonia prevents the ALD process from depositing the metal oxide onto the dielectric regions of the surface of the substrate.

* * * * *